US008984468B1

(12) United States Patent
Su et al.

(10) Patent No.: US 8,984,468 B1
(45) Date of Patent: Mar. 17, 2015

(54) METHOD TO ADAPTIVELY CALCULATE RESISTOR MESH IN IC DESIGNS

(71) Applicant: Cadence Design Systems, Inc., San Jose, CA (US)

(72) Inventors: Shun-Lin Su, Macungie, PA (US); Yue-Zhong Shu, Tokyo (JP); Chi-Yuan Lo, Basking Ridge, NJ (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/230,981

(22) Filed: Mar. 31, 2014

Related U.S. Application Data

(60) Provisional application No. 61/929,461, filed on Jan. 20, 2014.

(51) Int. Cl.
*G06F 17/50* (2006.01)

(52) U.S. Cl.
CPC ........ *G06F 17/5022* (2013.01); *G06F 17/5081* (2013.01)
USPC ................ 716/132; 716/55; 716/119; 703/14

(58) Field of Classification Search
CPC .................. G06F 17/50; G06F 9/455
USPC ............................. 716/55, 119, 132
See application file for complete search history.

(56) References Cited

U.S. PATENT DOCUMENTS 7,155,689 B2 * 12/2006 Pierrat et al. .................... 716/52
7,937,678 B2 * 5/2011 Lippmann et al. ............ 716/103

OTHER PUBLICATIONS

Kemp et al., "The Generation of a Mesh for Resistance Calculation in Integrated Circuits", IEEE Trans. on Computer-Aided Design of Integrated Circuits and Systems, vol. 7, Issue 10, pp. 1029-1037, Oct. 1988.

\* cited by examiner

*Primary Examiner* — Thuan Do
(74) *Attorney, Agent, or Firm* — Kenyon & Kenyon LLP

(57) ABSTRACT

Using an adaptive square mesh for parasitic extraction, small squares of a predetermined minimum size will be placed where accuracy in the parasitic calculations is most critical—around edges, contacts and vias, and corners. Then, in areas where the parasitic analysis is less critical, for example in open spaces, a more coarse grid consisting of larger squares may be used to calculate the parasitic values in those spaces. Squares in the mesh may increase in size gradually to provide more accurate results.

20 Claims, 10 Drawing Sheets

100

300

400

500

600

800

900

1010

METHOD TO ADAPTIVELY CALCULATE RESISTOR MESH IN IC DESIGNS

CROSS REFERENCE TO RELATED APPLICATION

This application claims priority to provisional application No. 61/929,461, filed Jan. 20, 2014.

BACKGROUND

Aspects of the present invention relate generally to field of circuit design and test and more specifically to using an adaptive square mesh for parasitic extraction during the verification and simulation of a circuit design.

Integrated circuit (IC) design is increasingly complex, sometimes involving millions of elements, shapes or geometries, and may be facilitated with an electronic design automation (EDA) tool that allows a designer to interactively position ("place") and connect ("route") various shapes on the circuit. The EDA tool then creates a circuit layout containing the physical locations and dimensions of the circuit's components, interconnections, and various layers from the original design that may then be fabricated, creating the IC. The designed IC is eventually fabricated by transferring or printing the circuit layout to a semiconductor substrate in a series of layers that collectively will form the features that constitute the devices that make up the components of the integrated circuit.

After or during the design and creation of an IC layout, validation, optimization, and verification operations are often performed on the IC layout using a set of testing, simulation, analysis and validation tools. These operations are conventionally performed in part to detect and correct placement, connectivity, and timing errors. For example, as part of the design and verification process, the IC design may undergo parasitic extraction. Parasitic extraction is a process that typically calculates the parasitic effects of the components and interconnects in a circuit design. The information related to the parasitic information (i.e. the parasitics) calculated and extracted from the design may aid in designing, characterizing, and optimizing the circuit design during the design and verification processes.

Conventional methods of parasitic extraction use a mesh to calculate interconnect parasitics. However, the conventional process of calculating parasitics often results in millions of parasitics extracted from a typical design. Additionally, conventional methods of parasitic extraction often use a uniform grid of rectangular shapes or a grid of calculated triangular shapes overlaid on the regions of the circuit design. For more accurate results, small polygons are used to form the mesh which results in even larger numbers of parasitic values extracted from the design. The extraction of so many parasitic values takes a significant amount of time and processing resources.

Accordingly, there is a need in the art to efficiently and accurately extract parasitic values from a circuit design.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

Using an adaptive square mesh for parasitic extraction, small squares of a predetermined minimum size will be placed where accuracy in the parasitic calculations is most critical—around edges, contacts and vias, and corners. Then, in areas where the parasitic analysis is less critical, for example in open spaces, a more coarse grid consisting of larger squares may be used to calculate the parasitic values in those spaces. Squares in the mesh may increase in size gradually to provide more accurate results.

In some embodiments, using such an adaptive square mesh in circuits with high voltage and high current, where the accuracy of the parasitic resistance calculations is of utmost importance, the adaptive square mesh has been shown to be at least as accurate as the conventional methods of parasitic extraction while decreasing the number of parasitic resistors extracted from a design by up to fifty percent. Being able to extract fewer parasitics even in more critical design constraints speeds up not only the parasitic extraction step, but also all subsequent stages of verification that use the extracted values for simulation and analysis, for example netlist extraction, simulation, and DC analysis.

Figure 1:
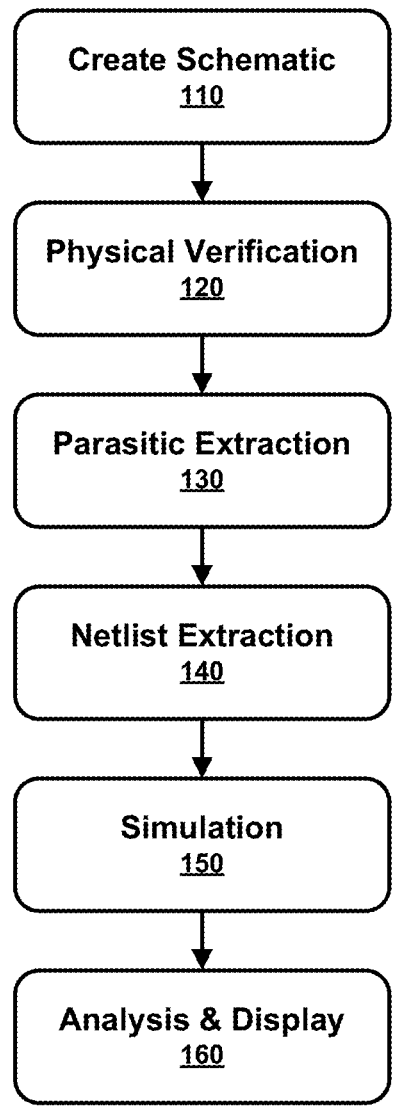
FIG. 1 illustrates an exemplary method for circuit design and verification using an adaptive mesh for parasitic extraction according to an embodiment of the present invention.

FIG. 1 illustrates an exemplary method 100 for circuit design and verification using an adaptive mesh for parasitic extraction according to an embodiment of the present invention. As shown in FIG. 1, a circuit designer initially creates or accesses a circuit schematic (block 110). Then that schematic may undergo physical verification (block 120). Physical verification may include design rule checking (DRC), layout versus schematic (LVS) analysis, electrical rule checking (ERC), and/or other related checks to confirm that the schematic meets certain design criteria.

The verified schematic may then undergo parasitic extraction (block 130). In an embodiment of the present invention, the parasitic extraction is primarily directed to the calculation of parasitic resistance, though other parasitics, including parasitic capacitance, also may be considered.

Methods for applying an adaptive mesh during parasitic extraction are described further herein. Such an adaptive mesh is particularly useful in a high voltage, high current design such as with a PowerMOS transistor, with a high count of parasitic resistors. In such situations, resistance accuracy is highly important. For example, in circuits designed for use in automotive applications, the designed circuits are often sparse, and may be designed with larger semiconductor technologies (e.g., 180 nm). Under such circumstances, accurate and efficient parasitic resistance extraction may be of particular interest.

Once the parasitics of the schematic are calculated, the netlist may be extracted from the layout of the design (block 140). Using the calculated parasitics and the netlist for the design, the circuit may then undergo simulation (block 150). Simulation typically provides tools for analysis and verification to confirm that the design meets the designer's desired goals. Simulation may be aided by one or more models of the circuit that are informed by the extracted parasitics. The results of the simulation and analysis may then be presented to the user, for example, via a display or other output (block 160). Additional design and verification steps may be implemented but are immaterial to the operation of the present invention.

Figure 2A:
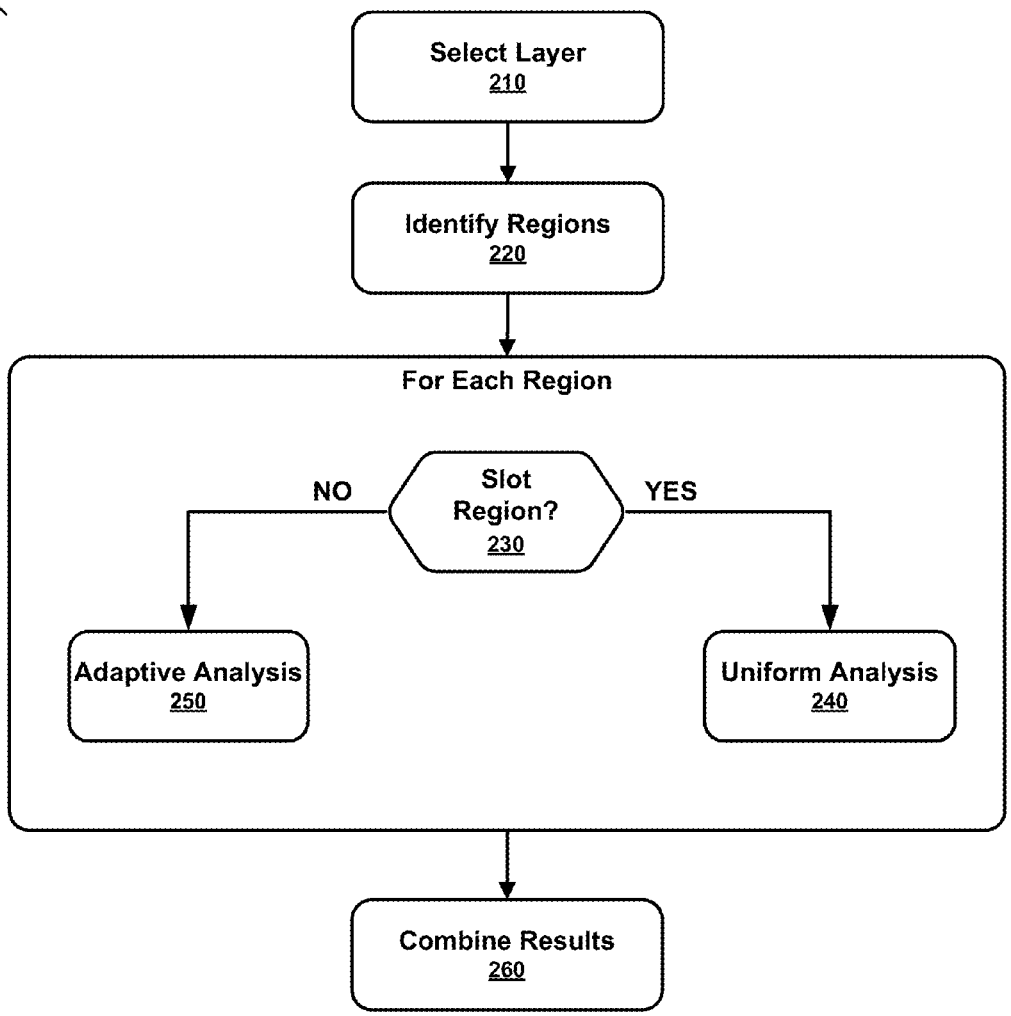
FIG. 2A illustrates an exemplary method for parasitic extraction according to an embodiment of the present invention.

FIG. 2A illustrates an exemplary method 130 (from FIG. 1) for parasitic extraction according to an embodiment of the present invention. As shown in FIG. 2A, a user or circuit designer may preliminarily select a mask layer of the circuit design for analysis (block 210). As previously noted, a design may include many parasitic resistors. By analyzing one mask layer at a time, the parasitic extraction and analysis may provide a smaller amount of data that is easier and more efficient to analyze.

Once a layer of the design is ready for parasitic extraction, various mesh regions within the layer may be identified (block 220). For example, certain regions of the design may include long thin strips of metal. These metal slots form a long resistor path within which the current is uniform. As a result, analysis of such slots is straightforward, and so the detailed parasitics provided with an adaptive mesh grid are not required. Therefore, because the regions of the design having such slots may be analyzed differently from the rest of the design, the slot regions are identified as distinct and separate regions.

Figure 3:
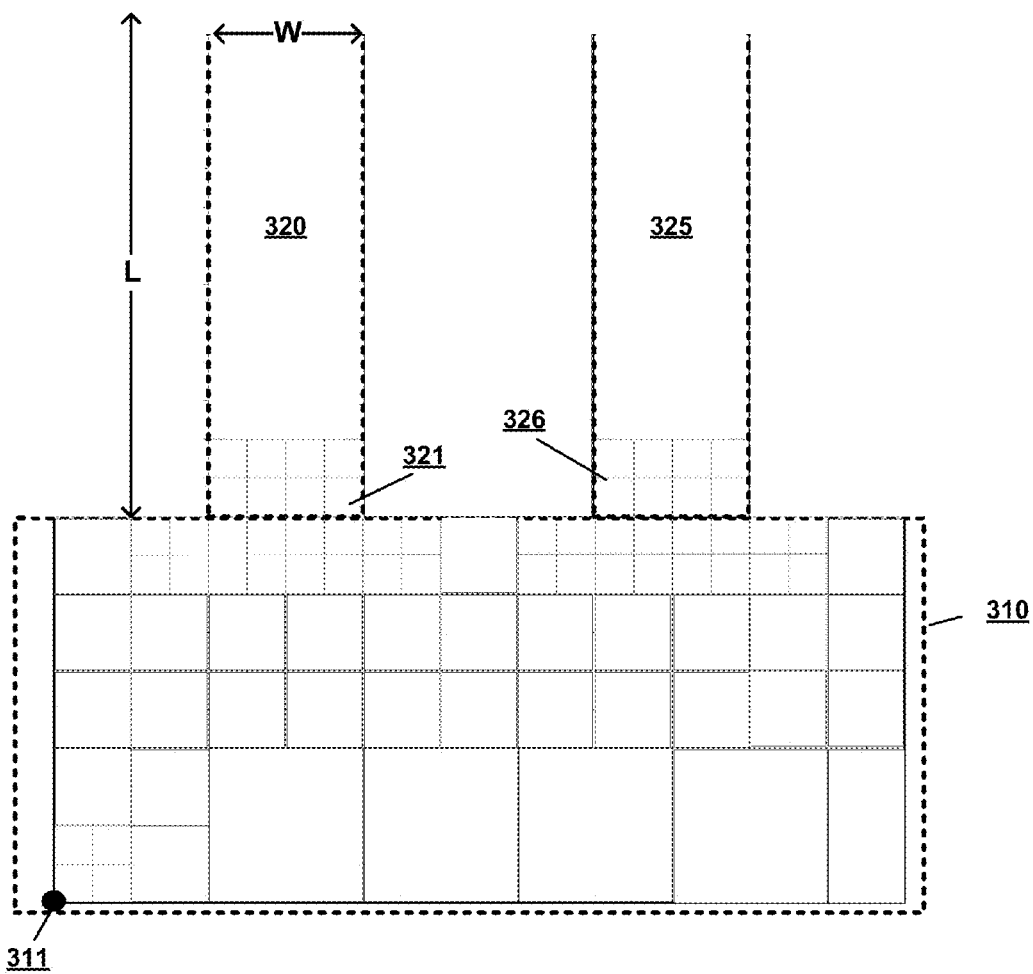
FIG. 3 illustrates an exemplary circuit design overlaid with an exemplary mesh for parasitic extraction according to an embodiment of the present invention.

FIG. 3 illustrates an exemplary circuit design 300 overlaid with an exemplary mesh for parasitic extraction according to an embodiment of the present invention, including exemplary slot regions 320 and 325.

Figure 2B:
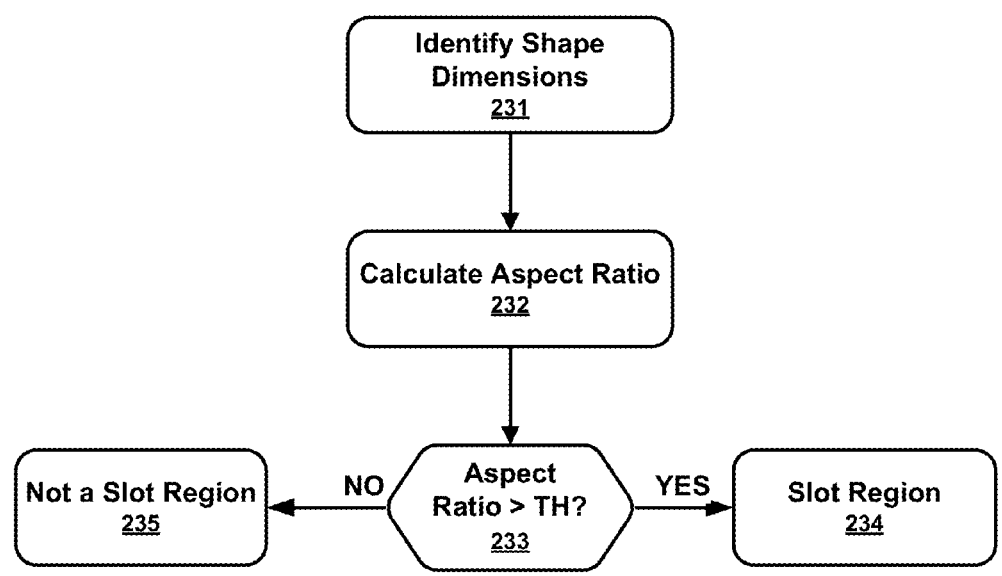
FIG. 2B illustrates an exemplary method for identifying slot regions according to an embodiment of the present invention.

FIG. 2B illustrates an exemplary method 230 (from FIG. 2A) for identifying slot regions according to an embodiment of the present invention. As shown in FIG. 2B, a shape may be evaluated to determine if it should be considered a slot by identifying the dimensions of the shape (block 231). Then, the aspect ratio of the shape is determined (block 232). The aspect ratio is calculated as the length of the shape (L) divided by the width of the shape (W). An exemplary length (L) and width (W) for calculating an aspect ratio are illustrated on shape 320 of FIG. 3.

Once the aspect ratio of a shape is calculated, the aspect ratio may be compared to a predetermined threshold (block 233). The predetermined threshold may be any value that the circuit designer or EDA developer sets. According to an aspect of an embodiment, the predetermined threshold for the aspect ratio may be set to be an integer such as 6 or 8. If the aspect ratio of the shape is greater than the predetermined threshold, the shape is identified as belonging to a slot region (block 234). However, if the aspect ratio of the shape is not greater than the predetermined threshold, the shape is not considered to be part of a slot region (block 235).

Returning to FIG. 2A, for each identified region, if the region is a slot region (block 230), a traditional uniform analysis may be applied (block 240). In FIG. 3, regions 310, 320, and 325 would be identified for mesh analysis in the identified layer. Regions 320 and 325 are identified as slot regions and therefore may be analyzed separately from the rest of the mask layer. Such separate analysis may be accomplished by analyzing the regions in separate stages, or by splitting the mask into two layers, one layer including the slot regions 320 and 325 and one layer including the adaptive region 310. Then a traditional uniform parasitic extraction may be applied to the slot regions. For example, a traditional square counting method may be used to analyze the slot regions. When using a traditional method of analysis on certain regions, 2-4 grids may be applied consistent with an adaptive mesh at each end of the region to ensure a smooth transition between regions. FIG. 3 shows exemplary adaptive mesh portions 321 and 326. The uniform mesh analysis then applies a mesh of rectangles that are of a uniform size to the remainder of the slot region.

As shown in FIG. 2A, if the identified region is not a slot region (block 230), an adaptive square analysis may be applied (block 250). The methods of applying an adaptive square analysis are further detailed below. Once all the identified regions in the layer have been analyzed and the parasitic resistance calculated for each region, the results of each region are combined (block 260). A single set of results for the selected mask layer, including a calculation of the parasitic effects in the components and interconnects within the mask layer of the circuit design, may be provided as a network of calculated resistances.

Figure 4:
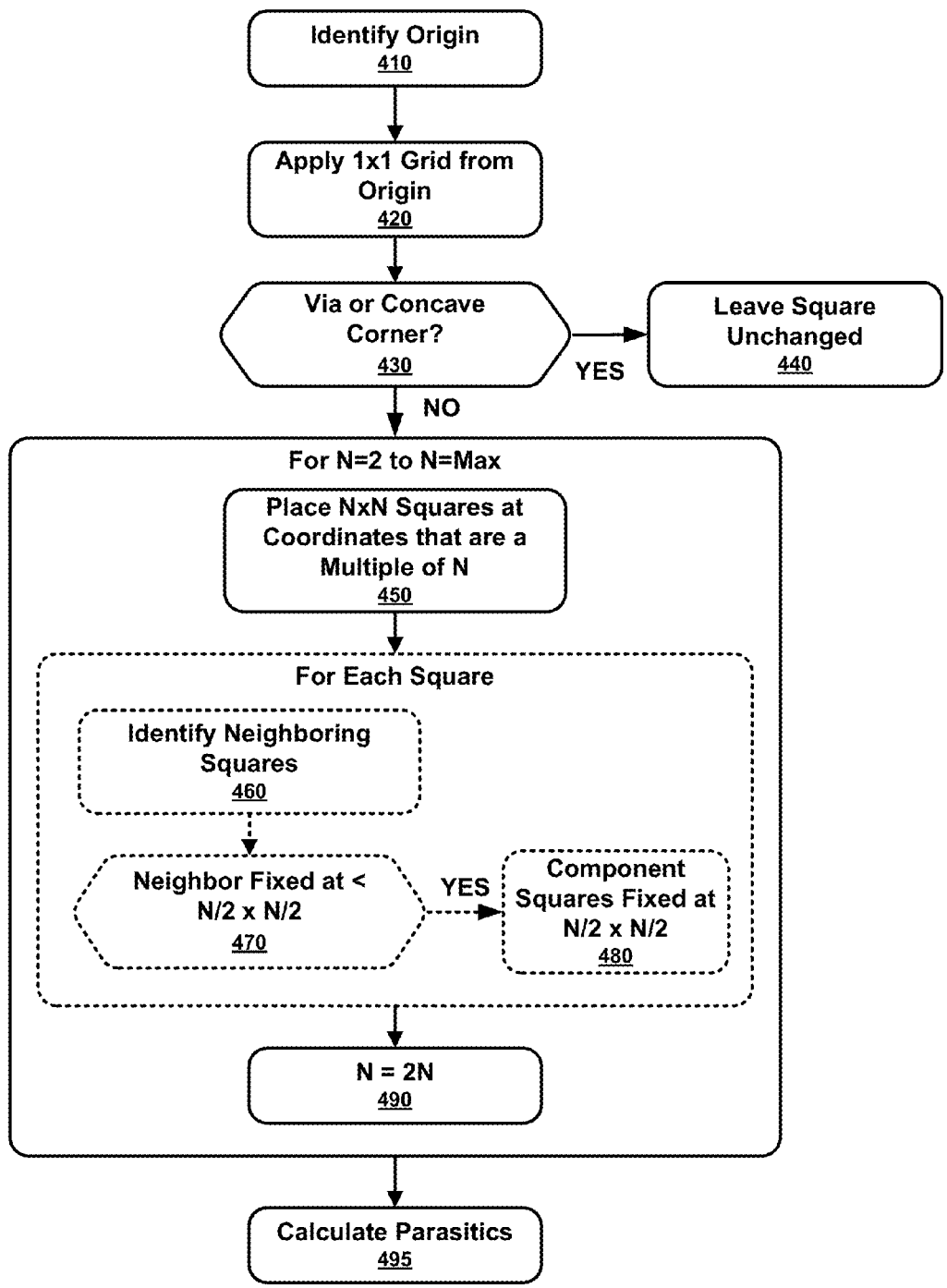
FIG. 4 illustrates an exemplary method for parasitic extraction using an adaptive square mesh according to an embodiment of the present invention.

FIG. 4 illustrates an exemplary, more detailed series of steps for adaptive square mesh-based parasitic extraction 250 according to an embodiment of the present invention. As shown in FIG. 4, the origin of the polygon representing the region undergoing analysis may be identified (block 410). For example, the origin may be identified as the lower left corner of a rectangle that bounds the region. In FIG. 3, the origin of region 310 is shown at 311 and in FIG. 5, the origin of region 500 is shown at 510.

In FIG. 4, a uniform grid, consisting of a predetermined minimum size (M×M), is applied to the region relative to the identified origin (block 420). Consequently, an M×M square will be placed at the lower left corner of the bounding rectangle and then M×M sized squares will be placed in a grid throughout the rest of the region. The predetermined minimum M may be set by default, or may be specified by the circuit designer. An exemplary predetermined minimum M is 2 um. Thus, a 1×1 square in the grid is considered to have actual dimensions of M×M. Then for N=2 until N=Max, squares increasing in size by multiples of 2 will be placed in the region. The predetermined maximum value of N may be a default value or may be set by the designer. An exemplary predetermined maximum will provide squares having dimensions of 64 um shown as 32×32 squares in the grid.

Preliminarily, any 1×1 square containing any part of an edge, contact or via, or corner (block 430), will remain fixed (block 440). For example, FIG. 5 illustrates exemplary regions of an exemplary design with an adaptive square mesh placed according to an embodiment of the present invention.

Figure 5:
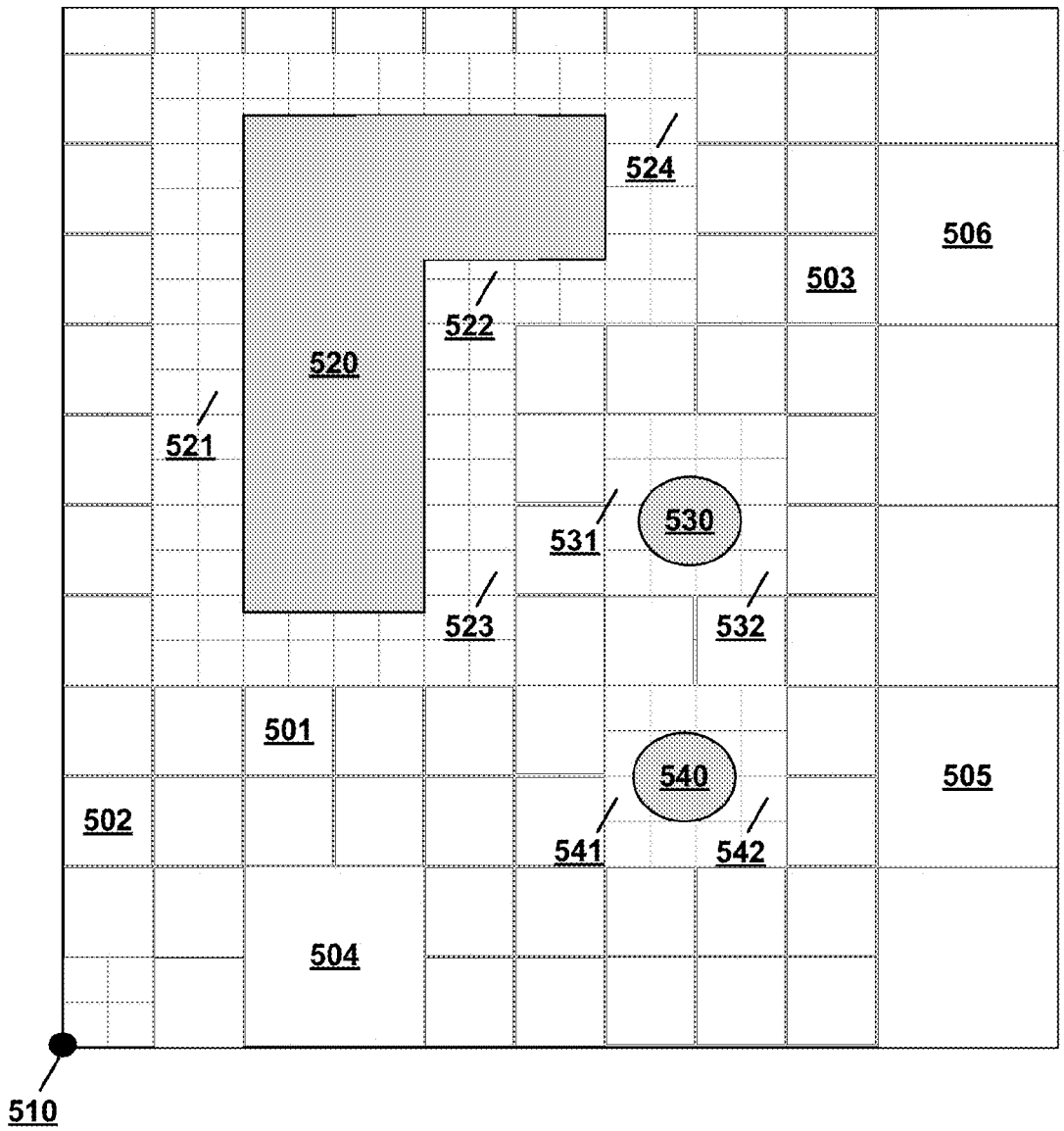
FIG. 5 illustrates exemplary regions of an exemplary design with an adaptive square mesh according to an embodiment of the present invention.

In FIG. 5, shape 520 is a polygon that represents a component in the circuit design and shapes 530 and 540 represent vias in the design. Note that the vias, shapes, and grid squares are not shown to scale for ease of illustration. As shown, the minimum 1×1 squares around the vias 530 and 540, including for example squares 531 and 541, are fixed. Additionally, the minimum 1×1 squares, including squares 521 and 522, are preserved around the edges of the polygon 520.

Returning to FIG. 4, to place larger mesh squares, N×N sized squares are placed at the (x,y) Cartesian coordinates of the grid that are a multiple of N (block 450). Then the neighbors of an N×N square are identified (block 460). If the neighbor of any N×N square is fixed at a size less than N/2× N/2 (block 470), the component squares of the N×N square will remain unchanged at N/2×N/2 (block 480). As shown in FIG. 5, this includes, for example, squares 501, 502, and 503 which are fixed at 2×2 sized squares. This allows for a gradual grid transition between squares of different sizes. Returning to FIG. 4, after all possible N×N squares are placed, N is increased to 2−N (block 490). Additional details of the method for placing squares in the grid will be provided below with reference to FIG. 6.

Although the gradual square size increase described herein is fixed at single increments, the transition between square sizes may happen more abruptly such that larger squares are placed wherever possible without concern for the size of neighboring squares. In that case, blocks 460-480 in FIG. 4 are unnecessary. Or an alternate transition scheme may be implemented. However, the single increment transition will provide more accurate results. Depending on the predetermined maximum value of N, there may be many levels of square increments. For example, there may be five or more levels of square size increase including squares of size 2×2, 4×4, 8×8, 16×16, and 32×32.

As shown in FIG. 4, once the squares of the mesh are placed, the parasitics for the region may then be calculated (block 495).

As previously noted, FIG. 5 illustrates an exemplary design with an adaptive square mesh placed according to an embodiment of the present invention. In FIG. 5, shape 520 is a polygon that represents a component in the circuit design and shapes 530 and 540 represent vias in the design. As shown, minimum 1×1 sized squares have been placed around the vias 530 and 540 and the edges of the polygon 520 where the edge of the polygon does not fall directly on a grid line. The squares immediately adjacent to the shapes, including for example squares 521, 522, 531 and 541, are then fixed at the minimum 1×1 size. Then larger squares are placed in open areas not immediately adjacent to a shape. As shown in FIG. 5, this includes, for example, squares 501, 502, and 503 which are 2×2 sized squares and squares 504, 505, and 506 which are 4×4 sized squares.

Figure 6:
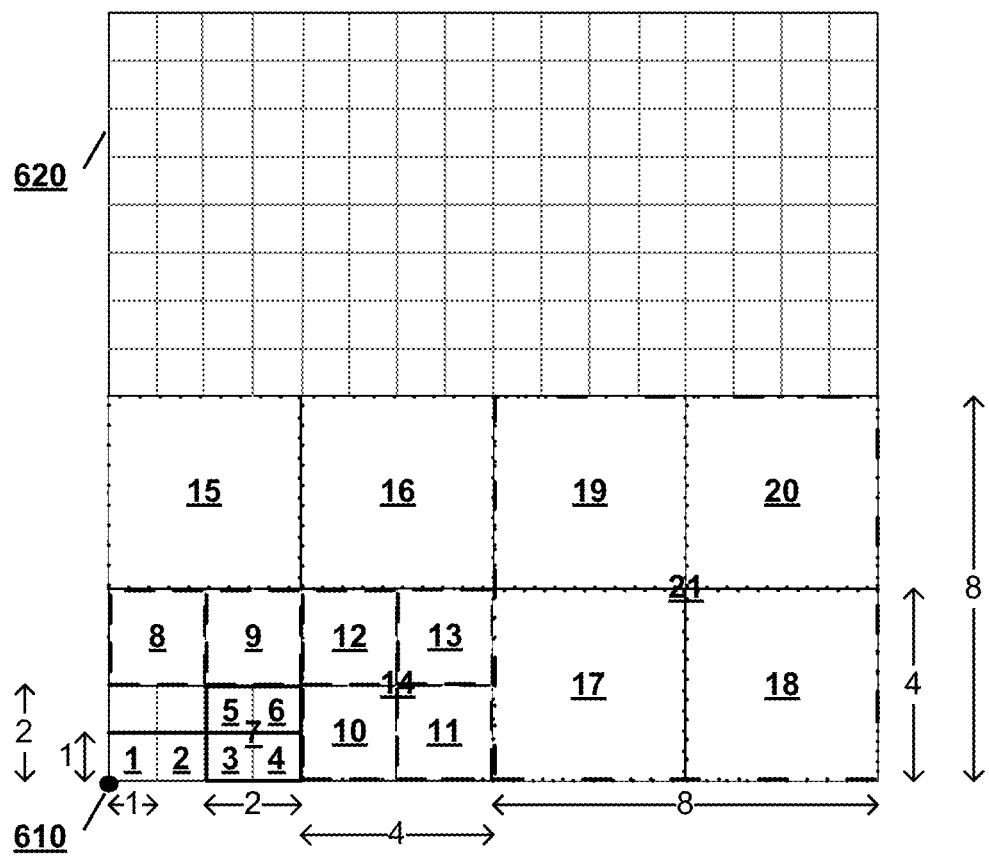
FIG. 6 illustrates an exemplary adaptive grid according to an embodiment of the present invention.

FIG. 6 illustrates an exemplary adaptive grid 600 according to an embodiment of the present invention. In FIG. 6, the grid 600 is initially made up of 1×1 squares filing the entire polygon 620 from the origin 610 of the polygon 620. For example, squares 1, 2, 3, 4, 5, and 6 are each 1×1. Then, starting at coordinates that are a multiple of 2, 2×2 squares are placed in the grid 600. For example, squares 7, 8, 9, 10, 11, 12, and 13 are 2×2 squares placed at coordinates that are multiples of 2 (e.g., (2×0), (0×2), (2×2), (4×0), (6×0), (4×2), and (6×2) respectively). The square at the origin (coordinates (0×0)) may be fixed as a 1×1 square. Therefore the neighboring squares will also be fixed as 1×1 squares because larger squares cannot be placed at coordinates (0×1) or (1×0).

Then, 4×4 sized squares are placed at coordinates that are a multiple of 4 in the grid 600. For example, squares 14, 15, 16, 17, 18, 19 and 20 are 4×4 squares placed at coordinates that are multiples of 4 (e.g., (4×0), (0×4), (4×4), (8×0), (12× 0), (8×4), and (12×4) respectively). Then 8×8 sized squares are placed at coordinates that are a multiple of 8 in the grid 600. For example, square 21 is placed at coordinates (8×0). The process of square placement will continue until the predetermined maximum square size is reached.

It will be apparent that certain placed squares may be replaced by a larger square. For example, squares 3, 4, 5, and 6 of size 1×1 were initially placed on the grid 600. However, square 7 is a 2×2 square that replaces these four 1×1 squares. Similarly, squares 10, 11, 12, and 13 were initially placed on the grid 600 but were replaced by 8×8 square 21. Not all squares that would be placed according to method described with reference to FIG. 4 have placed in the grid 600 for ease of display.

According to an embodiment, the neighbors of a square in the grid include all squares immediately adjacent to the square. For example, the neighbors of square 14 include squares 7, 9, 16, and 17. Additionally, the component parts of a square are all the squares that have been placed on the grid within that square. For example, the component squares of square 14 are squares 10, 11, 12, and 13.

Figure 7:
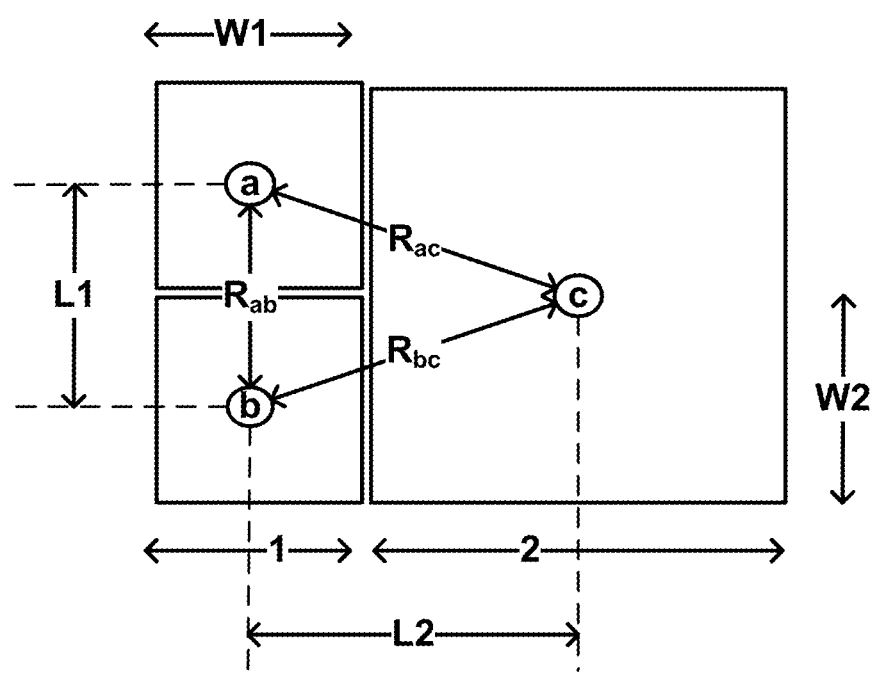
FIG. 7 illustrates exemplary mesh squares for parasitic resistance calculation according to an embodiment of the present invention.

As previously noted, once the adaptive square mesh is placed in an identified region, the interconnect parasitic resistance values within the region may be calculated. FIG. 7 illustrates exemplary mesh squares for parasitic resistance calculation according to an embodiment of the present invention. Three squares having interconnect points a, b, and c respectively are illustrated where squares a and b are 1×1 squares and square c is a 2×2 square. The value of the parasitic resistance created between the interconnect points of any two squares of the mesh is calculated as R=L/W. Then for similarly sized squares a and b, the parasitic resistance $R_{ab}$=L1/W1=1/1=1.

However, for $R_{ac}$ and $R_{bc}$, this is not such a simple calculation, because the value of L2 relies on the distance between the two points of interconnect. This distance may be calculated or estimated in multiple ways, for example using the either the Manhattan method or the Euclidean method of calculating distances. Under the Manhattan method, the distance between two points is calculated as the sum of the horizontal and vertical path from one point to another parallel to the grid lines. This method is preferable for interconnections having a straight current flow approximately parallel to the X-axis or Y-axis of the grid. Then, using the Manhattan method, L2=1.5. Under the Euclidean method, the Pythagorean theorem is used to calculate the straight distance between the two points of interconnect. This method is preferable for interconnection having a slant current flow direction. Then, using the Euclidean method, with the coordinates of interconnect point of b estimated as (0,0) and the coordinates of the interconnect point of c estimated as (1.5, 0.5), L2 for $R_{bc}=\sqrt{((0-1.5)^2+(0-0.5)^2)}=\sqrt{(2.25+0.25)}=1.58$.

Since it is unknown whether the calculation points for two adjacent squares will be more aligned in a straight path or on a diagonal, it will not be clear in advance whether the Manhattan method or the Euclidean method will provide the more accurate calculation. Therefore, according to an embodiment, to calculate the parasitic resistance value between two adjacent squares, the average of the Manhattan value and the Euclidean value will be used. Therefore L2=1.54 and $R_{bc}$=L2/W2=1.54/1=1.54.

Figure 8:
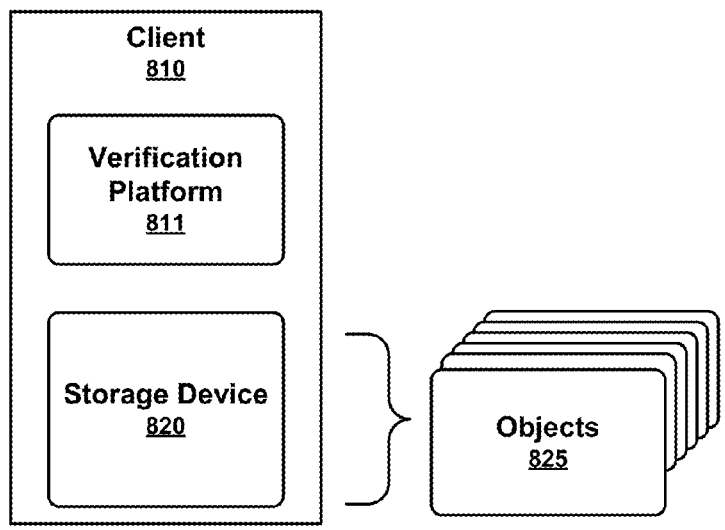
FIG. 8 is a simple block diagram illustrating components of an exemplary system according to an embodiment of the present invention.

A user or designer may access a verification and test platform that provides for parasitic extraction, for example an EDA application to model and analyze a design in a standalone client system, client-server environment, or a networked environment. FIG. 8 is a simple block diagram illustrating components of an exemplary system 800 according to an embodiment. As shown in FIG. 8, a system 800 may comprise a client 810 executing a verification platform 811 and having a memory storage 820. The client 810 may be any computing system that executes a verification platform 811 or otherwise facilitates access to memory storage 820, for example a personal computer. The client 810 may include a processor that performs a method in accordance with the disclosed embodiments. Such a client would be part of an overall design and verification system in accordance with the disclosed embodiments.

Hardware models, instruction sets, software packages, instances of the modeled components, state information for the modeled components, timing files, netlists and other objects 825 used by the verification platform 811 may be stored in memory storage 820. A user may access the objects 825 stored in memory storage 820 with the client 810 via the verification platform 811, where the verification platform 811 is capable of accessing memory storage 820 and displaying the objects 825 and the data associated with the simulation. The verification platform 811 may include a user interface, for example a program, application or middleware that acts as a frontend to and facilitates access to objects in memory storage 820. The verification platform 811 may facilitate parasitic extraction using the tools and procedures described herein. The user may interact with the verification platform 811 through a number of input devices, such as by inputting a selection as with a mouse or inputting a request as with a keyboard. The user may observe the simulation results on an output device or display. The verification platform 811 may run in an application window controlled by the user.

As shown in FIG. 8, a client 810 may be a stand-alone system, as may be of particular interest where the components being simulated are highly confidential. Additionally, according to an aspect of an embodiment as shown in FIG. 9, a client 910 may be part of a networked environment.

Figure 9:
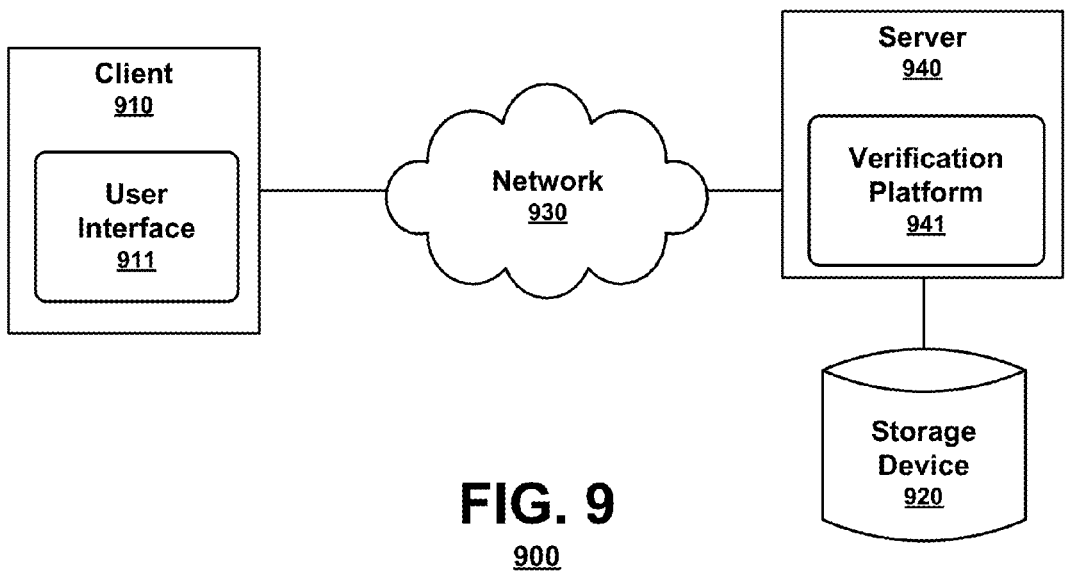
FIG. 9 is a simple block diagram illustrating components of an exemplary system according to an embodiment of the present invention.

FIG. 9 is a simple block diagram illustrating components of an exemplary system 900 according to an embodiment. As shown in FIG. 9, system 900 may include a client 910 having a user interface 911. The client 910 may be connected to a server 940 via a network 930. The verification platform 941, which in this embodiment is located at server 940, may have access to storage device 920 storing hardware models, instruction sets, software packages, instances of the modeled components, state information for the modeled components, timing files, netlists and other objects utilized by the verification platform 941. The server 940 may include a processor that performs a method in accordance with the disclosed embodiments. Such a server then would be part of an overall verification and design system in accordance with the disclosed embodiments.

A user may access a verification platform 941 at the server 940 via the client 910 having a user interface 911 capable of accessing and displaying verification platform 941 and the processes executed thereby. The client 910 may be any computing system that facilitates the user accessing storage device 920, for example a personal computer. The network 930 may be a wired or wireless network that may include a local area network (LAN), a wide area network (WAN), the Internet, or any other network available for accessing storage device 920 from the client 910.

The server 940 may be a network server accessible to the client 910 via the network 930 that may manage access to storage device 920. The user interface 911 may receive instructions regarding verification of a circuit design from the user and utilizing the objects stored in memory storage 920, facilitate a display parasitic extraction results gathered during the verification. Multiple different clients (not shown) may access storage device 920 via the network 930 and request access to the objects stored therein.

In another networked environment, the verification platform may be executed on a network capable client and access the models, packages and other objects stored in one or more storage devices via a network and communications server.

Figure 10:
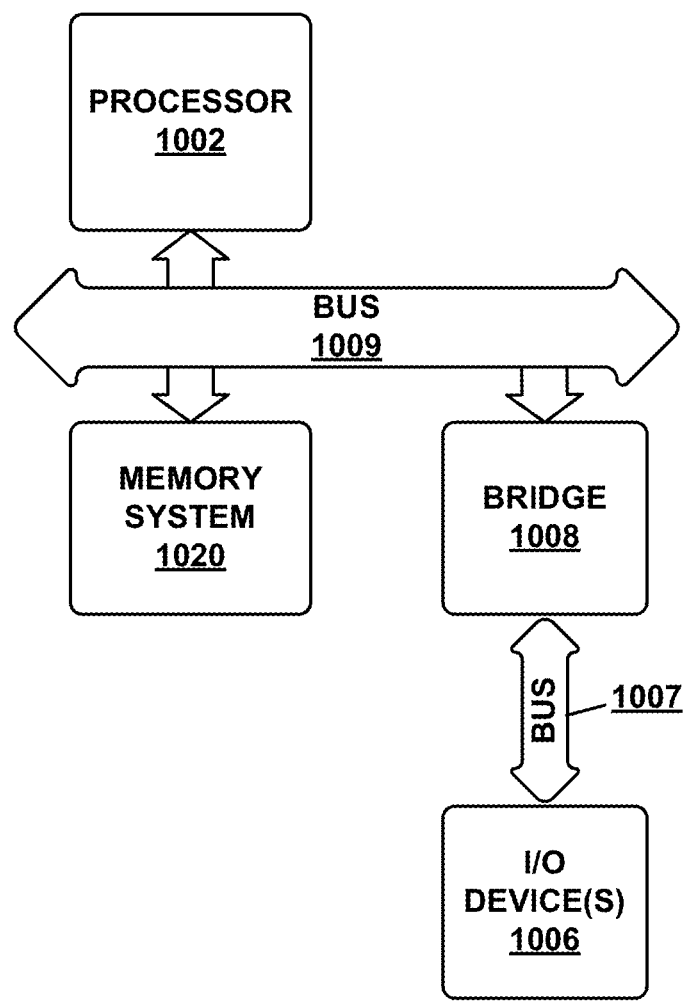
FIG. 10 is a simple block diagram illustrating components of an exemplary client according to an embodiment of the present invention.

FIG. 10 is a simple block diagram illustrating components of an exemplary client 1010 according to an embodiment of the present invention. As shown in FIG. 10, the client 1010 configured to execute the verification platform as described herein may include a processor 1002, a memory system 1020 and one or more input/output (I/O) devices 1006 in communication. The communication can be implemented in a variety of ways and may include one or more computer buses 1007, 1009 and/or bridge devices 1008 as shown in FIG. 10. The I/O devices 1006 can include network adapters and/or mass storage devices from which the client 1010 can receive commands for executing the simulation.

As shown in FIG. 8, a client 1010 may be a stand-alone system, as may be of particular interest where the components being simulated are highly confidential. Additionally, according to an aspect of an embodiment as shown in FIG. 9, a client 1010 may be part of a networked environment.

The features of the embodiments of the present invention may be implemented in hardware, software, firmware, or a combination thereof and utilized in systems, subsystems, components or subcomponents thereof. In some applications, the elements described hereinabove may be provided as elements of an integrated software system, in which the blocks may be provided as separate elements of a computer program. Some embodiments may be implemented, for example, using a non-transitory computer-readable storage medium or article which may store an instruction or a set of instructions that, if executed by a processor, may cause the processor to perform a method in accordance with the embodiments. Other applications of the present invention may be embodied as a hybrid system of dedicated hardware and software components. Moreover, not all of the elements described herein need be provided, need be provided as separate units, or in the order or placement described. For example, it is noted that the arrangement of the blocks in FIG. 2A do not necessarily imply a particular order or sequence of events, nor are they intended to exclude other possibilities. For example, the operations depicted at blocks 240 and 250 may occur in an alternate order or substantially simultaneously with each other. Such implementation details are immaterial to the operation of the present invention unless otherwise noted above.

A non-transitory computer readable storage medium may include any medium that can store information. Examples of a computer readable storage medium include electronic circuits, semiconductor memory devices, ROM, flash memory, erasable ROM (EROM), floppy diskette, CD-ROM, optical disk, hard disk, fiber optic medium, or any electromagnetic or optical storage device. In addition, a server or database server may include computer readable media configured to store executable program instructions.

While the invention has been described in detail above with reference to some embodiments, variations within the scope and spirit of the invention will be apparent to those of ordinary skill in the art. Thus, the invention should be considered as limited only by the scope of the appended claims.

We claim:

1. A method of simulating a resistor, comprising:

creating, with a computer, a two-dimensional resistive mesh element distribution by placing a plurality of minimally sized square mesh elements in a grid pattern on a region of a circuit design;

modifying, with the computer, the two-dimensional resistive mesh element distribution by recursively placing larger square mesh elements throughout the resistive mesh element distribution according to placement rules;

simulating, with the computer, the resistance of the modified mesh element distribution; and outputting the simulation results to a display.

2. The method of claim 1, wherein the placement rules comprise not placing larger square mesh elements in regions of long metal strip, or adjacent to a contact location, or a polygon corner.

3. The method of claim 1, wherein the resistor is a parasitic resistance of a power MOS transistor.

4. The method of claim 1, where the larger square mesh elements are scaled relative to an input minimum size mesh by at least one of 2×2, 4×4, 8×8, 16×16, and 32×32.

5. The method of claim 1, wherein the placement rules comprise limiting an individual mesh element size transition to a neighboring mesh element to no more than a 2× size transition.

6. The method of claim 1, further comprising specifying an input minimum mesh element size by layer.

7. The method of claim 1, wherein the placement rules comprise modifying each region containing a long metal strip by placing mesh transition regions at each strip end, and by performing square counting between the mesh transition regions.

8. A non-transitory computer readable medium storing instructions that when executed by a processor perform a method of simulating a resistor, the method comprising:

using a computer, creating a two-dimensional resistive mesh element distribution by placing a plurality of minimally sized square mesh elements in a grid pattern on a region of a circuit design;

modifying the two-dimensional resistive mesh element distribution by recursively placing larger square mesh elements throughout the resistive mesh element distribution according to placement rules;

simulating the resistance of the modified mesh element distribution; and outputting the simulation results to a display.

9. The computer readable medium of claim 8, wherein the placement rules comprise not placing larger square mesh elements in regions of long metal strip, or adjacent a contact location or a polygon corner.

10. The computer readable medium of claim 8, where the larger square mesh elements are scaled relative to an input minimum size mesh by at least one of 2×2, 4×4, 8×8, 16×16, and 32×32.

11. The computer readable medium of claim 8, wherein the placement rules comprise limiting an individual mesh element size transition to a neighboring mesh element to no more than a 2× size transition.

12. The computer readable medium of claim 8, further comprising specifying an input minimum mesh element size by layer.

13. The computer readable medium of claim 8, wherein the placement rules comprise modifying each region containing a long metal strip by placing mesh transition regions at each strip end, and by performing square counting between the mesh transition regions.

14. A system comprising:
a memory to store an integrated circuit design; and
a processor configured to simulate the design by:
creating a two-dimensional resistive mesh element distribution by placing a plurality of minimally sized square mesh elements in a grid pattern on a region of a circuit design;
modifying the two-dimensional resistive mesh element distribution by recursively placing larger square mesh elements throughout the resistive mesh element distribution according to placement rules;
simulating the resistance of the modified mesh element distribution; and
outputting the simulation results to a display.

15. The system of claim 14, wherein the placement rules comprise not placing larger square mesh elements in regions of long metal strip, or adjacent to a contact location or a polygon corner.

16. The system of claim 14, wherein the resistor is a parasitic resistance of a power MOS transistor.

17. The system of claim 14, where the larger square mesh elements are scaled relative to an input minimum size mesh by at least one of 2×2, 4×4, 8×8, 16×16, and 32×32.

18. The system of claim 14, wherein the placement rules comprise limiting an individual mesh element size transition to a neighboring mesh element to no more than a 2× size transition.

19. The system of claim 14, further comprising specifying an input minimum mesh element size by layer.

20. The system of claim 14, wherein the placement rules comprise modifying each region containing a long metal strip by placing mesh transition regions at each strip end, and by performing square counting between the mesh transition regions.

* * * * *